US012648476B2

(12) United States Patent
Tsai et al.

(10) Patent No.:   US 12,648,476 B2
(45) Date of Patent:       Jun. 2, 2026

(54) ENERGY CONVERSION MODULE COMPRISING AN ENCAPSULATION STRUCTURE AND ENERGY CONVERSION DEVICE

(71) Applicant: ACTRON TECHNOLOGY CORPORATION, Taoyuan City (TW)

(72) Inventors: Hsin-Chang Tsai, Taoyuan City (TW); Ching-Wen Liu, Taoyuan City (TW)

(73) Assignee: ACTRON TECHNOLOGY CORPORATION, Taoyuan City (TW)

( * ) Notice: Subject to any disclaimer, the term of this patent is extended or adjusted under 35 U.S.C. 154(b) by 561 days.

(21) Appl. No.: 18/191,883

(22) Filed: Mar. 29, 2023

(65) Prior Publication Data

US 2024/0282652 A1     Aug. 22, 2024

(30) Foreign Application Priority Data

Feb. 16, 2023     (TW) ................................. 112105501

(51) Int. Cl.
　　H10W 74/10          (2026.01)
　　H10W 72/50          (2026.01)
　　*H10W 74/00*          (2026.01)

(52) U.S. Cl.
　　CPC .......... H10W 74/111 (2026.01); H10W 72/50 (2026.01); *H10W 74/00* (2026.01)

(58) Field of Classification Search
　　CPC .................................................. H01L 23/3107
　　USPC .......................................................... 257/690
　　See application file for complete search history.

(56) References Cited

U.S. PATENT DOCUMENTS

| | | | |
|---|---|---|---|
| 2005/0280125 A1 | 12/2005 | Oliver et al. | |
| 2006/0044772 A1* | 3/2006 | Miura | H01L 25/072 |
| | | | 257/E23.101 |
| 2006/0220218 A1* | 10/2006 | Sheen | H01L 24/01 |
| | | | 257/697 |
| 2010/0078783 A1 | 4/2010 | Otremba | |
| 2016/0225745 A1 | 8/2016 | Beer et al. | |

(Continued)

FOREIGN PATENT DOCUMENTS

| | | |
|---|---|---|
| JP | 2017098276 | 6/2017 |
| JP | 2019220671 | 12/2019 |

OTHER PUBLICATIONS

"Search Report of Europe Counterpart Application", issued on Oct. 23, 2023, pp. 1-11.

(Continued)

*Primary Examiner* — Ajay Arora
(74) *Attorney, Agent, or Firm* — JCIPRNET

(57)                    ABSTRACT

Disclosed are an energy conversion module and an energy conversion device. The energy conversion module includes an encapsulation structure and an integrated module packaged therein, the integrated module includes a trace, a power chip, a transistor control element and an energy storage device. The trace includes at least two electrodes, one is exposed from a first surface of the encapsulation structure, and the other is exposed from a second surface of the encapsulation structure. The first surface is opposite to the second surface. The power chip is respectively connected to the two electrodes of the trace. The transistor control element controls the power chip to perform energy conversion through the trace. The energy storage device supplies energy to the transistor control element through the trace.

12 Claims, 5 Drawing Sheets

(56) References Cited

U.S. PATENT DOCUMENTS

| | | | |
|---|---|---|---|
| 2017/0141018 A1 | 5/2017 | Kawano et al. | |
| 2017/0263516 A1 | 9/2017 | Ishimaru et al. | |
| 2018/0047649 A1 | 2/2018 | Bando et al. | |
| 2019/0393136 A1* | 12/2019 | Tsai | ........................ H01L 25/16 |

OTHER PUBLICATIONS

"Office Action of Japan Counterpart Application", issued on Jul. 2, 2024, p. 1-p. 9.

* cited by examiner $$400 \begin{cases} 402 \\ 404 \\ 406 \end{cases} \quad 410 \begin{cases} 412 \\ 414 \\ 416 \\ 418 \end{cases} \quad 412 \begin{cases} EP1 \\ 4121 \\ 412S \\ w1 \\ w2 \end{cases} \quad 414 \begin{cases} w3 \\ 414G \end{cases} \quad 418 \begin{cases} 418V \\ 4182 \\ w6 \end{cases} \quad 416 \begin{cases} EP2 \\ w4 \\ w5 \\ 416D \\ 416P \end{cases}$$

ENERGY CONVERSION MODULE COMPRISING AN ENCAPSULATION STRUCTURE AND ENERGY CONVERSION DEVICE

CROSS-REFERENCE TO RELATED APPLICATION

This application claims the priority benefit of Taiwan application no. 112105501, filed on Feb. 16, 2023. The entirety of the above-mentioned patent application is hereby incorporated by reference herein and made a part of this specification.

BACKGROUND

Technical Field

The present disclosure relates to an energy conversion module and an energy conversion device.

Description of Related Art

Power elements may be applied to rectifiers, vehicle generators, and high-power module generators. In the technical field of automotive generators, a rectifier bridge is often adopted in order to perform AC-DC conversion. A rectifier bridge may be composed of power elements, and serves to supply rectified voltage as a basis for driving a load.

However, the problem of current encapsulation structure of automotive power elements lies in complex design and unstable structure.

SUMMARY

The present disclosure provides an energy conversion module and an energy conversion device having such energy conversion module, which is able to achieve the technical effect of miniaturization and stability.

An energy conversion module and an energy conversion device are provided. The energy conversion module includes an encapsulation structure and an integrated module packaged therein. The integrated module includes a trace, a power chip, a transistor control element and an energy storage device. The trace at least includes a first electrode and a second electrode. One of the first electrode and the second electrode is exposed from a first surface of the encapsulation structure, and the other of the first electrode and the second electrode is exposed from a second surface of the encapsulation structure. The first surface is opposite to the second surface. The power chip is respectively connected to the first electrode and the second electrode of the trace. The transistor control element controls the power chip to perform energy conversion through the trace. The energy storage device provides energy to the transistor control element through the trace.

In an embodiment of the present disclosure, the power chip includes several end portions, which include a control electrode, a first end portion and a second end portion. The trace includes a first connection portion, a second connection portion, a third connection portion and a fourth connection portion which are not connected to each other. The first connection portion is connected to the first end portion, and the second connection portion is connected to the control electrode, the third connection portion is connected to the second end portion, and the first connection portion has the first electrode. The first electrode is exposed from the first surface of the encapsulation structure, the third connection portion has the second electrode, and the second electrode is exposed from the second surface of the encapsulation structure. The energy storage device includes a first terminal and a second terminal, the first terminal is connected to the first connection portion, and the second terminal is connected to the fourth connection portion. The transistor control element is connected to the control electrode through the second connection portion, the transistor control element is connected to the second end portion through the third connection portion, the transistor control element is connected to the first end portion through the first connection portion, and the transistor control element is connected to the second terminal through the fourth connection portion.

In an embodiment of the present disclosure, the second electrode is coplanar with the second surface.

In another embodiment of the present disclosure, the several end portions of the power chip include a control electrode, a first end portion and a second end portion. The trace includes a first connection portion, a second connection portion, a third connection portion and a fourth connection portion which are not connected to each other. The first connection portion is connected to the first end portion, the second connection portion is connected to the control electrode, the third connection portion is connected to the second end portion, and the first connection portion has the second electrode. The second electrode is exposed from the first surface of the encapsulation structure, the third connection portion has the first electrode, and the first electrode is exposed from the second surface of the encapsulation structure. The energy storage device includes a first terminal and a second terminal, the first terminal is connected to the first connection portion, and the second terminal is connected to the fourth connection portion. The transistor control element is connected to the control electrode through the second connection portion, the transistor control element is connected to the second end portion through the third connection portion, the transistor control element is connected to the first end portion through the first connection portion, and the transistor control element is connected to the second terminal through the fourth connection portion.

In another embodiment of the present disclosure, the first electrode is coplanar with the second surface.

In an embodiment of the present disclosure, the power chip includes an insulated gate bipolar transistor (IGBT) or a metal oxide semiconductor field effect transistor (MOSFET).

The energy conversion device of the present disclosure includes the energy conversion module, a top terminal and a bottom terminal. The top terminal is in contact with the first surface of the encapsulation structure of the energy conversion module; the bottom terminal is in contact with the second surface of the encapsulation structure of the energy conversion module.

In yet another embodiment of the present disclosure, the top terminal is in contact with the first electrode exposed from the first surface of the encapsulation structure, and the bottom terminal is in contact with the second electrode exposed from the second surface of the encapsulation structure.

In still another embodiment of the present disclosure, the top terminal is in contact with the second electrode exposed from the first surface of the encapsulation structure, and the bottom terminal is in contact with the first electrode exposed from the second surface of the encapsulation structure.

In yet another embodiment of the present disclosure, the bottom terminal may have a concave surface, and the energy conversion module is disposed in the space formed by the concave surface.

On basis of the above, the present disclosure designs the energy conversion device as an integrated module, so that the energy conversion device has only one energy conversion module except the top terminal and the bottom terminal, and the two electrode terminals of the energy conversion module are respectively exposed, thereby forming a stable structure after being joined with the top terminal and the bottom terminal, which is especially suitable for vehicles that require large energy conversion and where the configuration portion is likely to be affected by bumping. In addition, when the chip is adapted for different requirements for positive electrode or negative electrode, the design of built-in trace helps to maintain the same directionality of the integrated module (that is, there is no need to change the configuration directions of the transistor control element and the energy storage device). Moreover, the integrated module of the present disclosure has a 3D packaging structure, so it is possible for the chip to have more areas for heat dissipation in the limited space of the element. In addition, the module integrated through the 3D packaging structure is able to shorten the distance of the electrical transmission path and inhibit parasitic problems.

In order to make the features of the present disclosure more obvious and understandable, the following specific embodiments are described in detail in conjunction with the accompanying drawings as follows.

DESCRIPTION OF THE EMBODIMENTS

Figure 1:
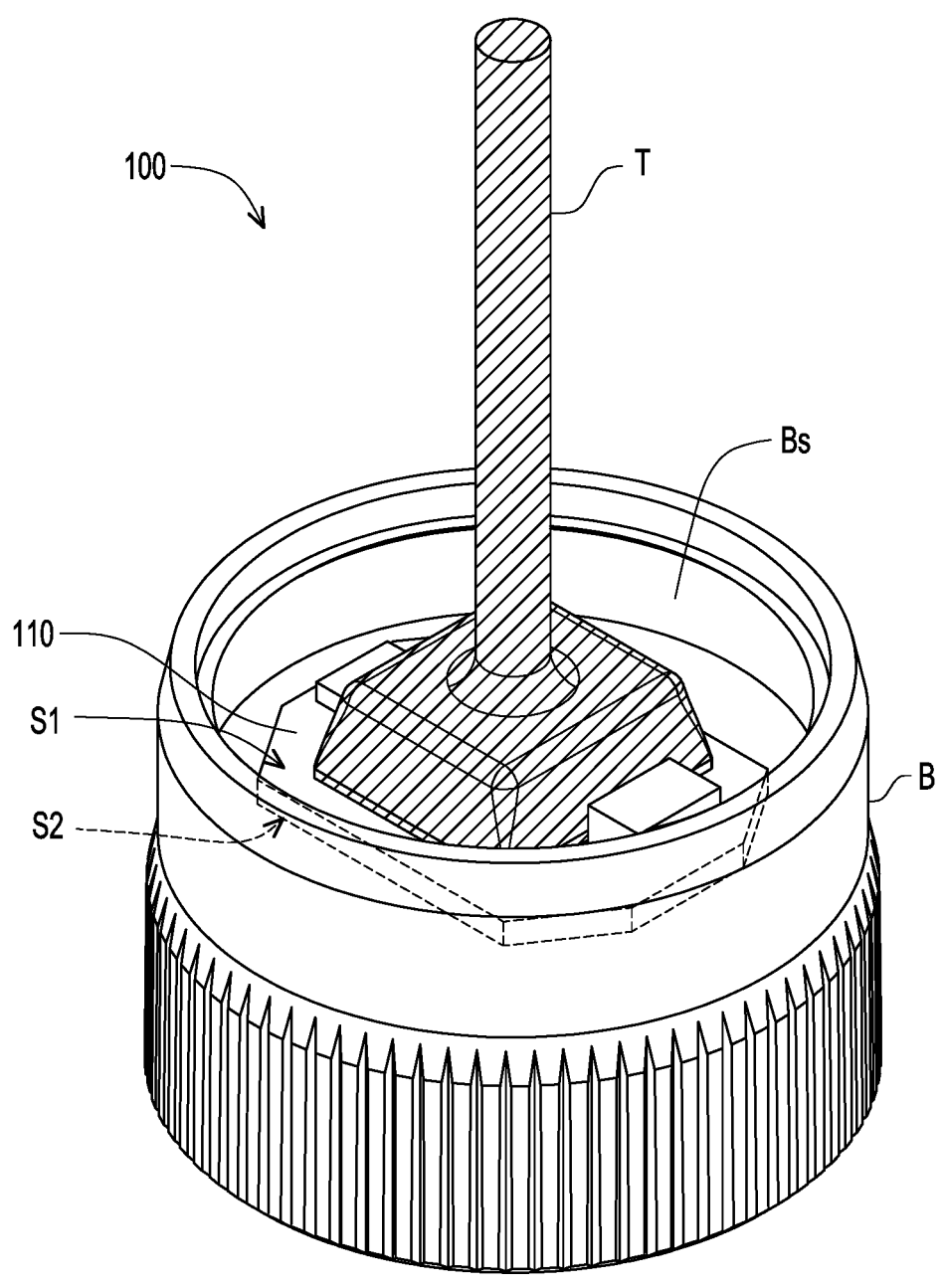
FIG. 1 is a perspective view of an energy conversion device according to an embodiment of the present disclosure.

FIG. 1 is a perspective view of an energy conversion device according to an embodiment of the present disclosure.

Referring to FIG. 1, the energy conversion device 100 of this embodiment includes an energy conversion module 110, a top terminal T and a bottom terminal B. The top terminal T is in contact with the first surface S1 of the energy conversion module 110; the bottom terminal B is in contact with the second surface S2 of the energy conversion module 110. In an embodiment, the top terminal T is, for example, a wire electrode, which includes a base that is in contact with the energy conversion module 110 and a lead wire connected to the base. In an embodiment, the bottom terminal B may have a concave surface Bs, and the energy conversion module 110 is disposed in the space formed by the concave surface Bs. In FIG. 1, the concave surface Bs of the bottom terminal B has a stepped shape, but the present disclosure is not limited thereto. In another embodiment, the concave surface Bs of the bottom terminal B may also be a smooth surface or have other designs. The detailed structure of the energy conversion module 110 is described below as a power diode.

In this embodiment, the shape of the bottom surface of the top terminal T is rectangular, but the present disclosure is not limited thereto. In another embodiment, the shape of the bottom surface of the top terminal T may be circular or hexagonal. In this embodiment, the material of the top terminal T may be selected from aluminum, copper or alloys thereof, such as copper alloy, aluminum alloy and the like.

In this embodiment, the shape of the bottom terminal B is circular, but the present disclosure is not limited thereto. In fact, the bottom terminal B may be designed in different shapes or forms to adapt to product design requirements, such as having a square or hexagonal shape, or not having a concave surface. In this embodiment, the material of the bottom terminal B may be selected from aluminum, copper or alloys thereof; preferably copper or aluminum.

Figure 2:
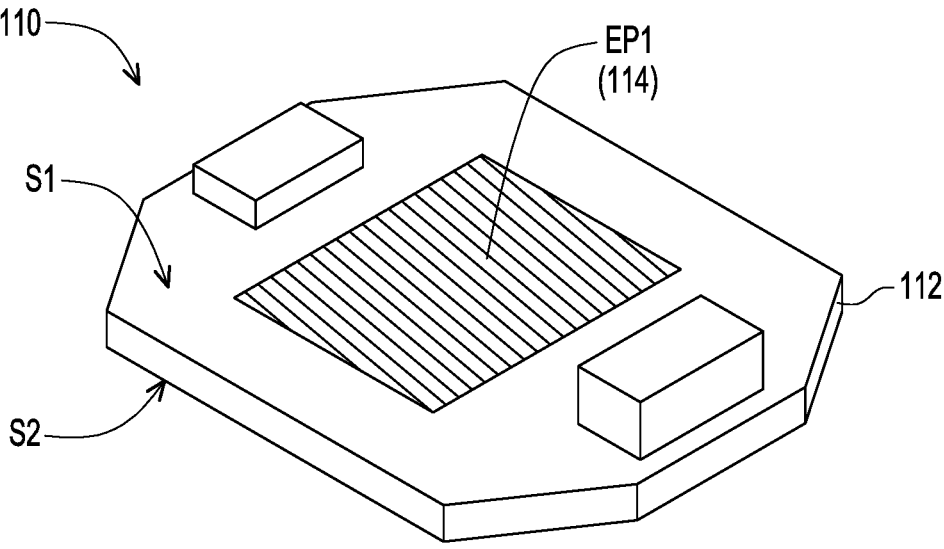
FIG. 2 is a front perspective view of an energy conversion module in the embodiment.
Figure 3:
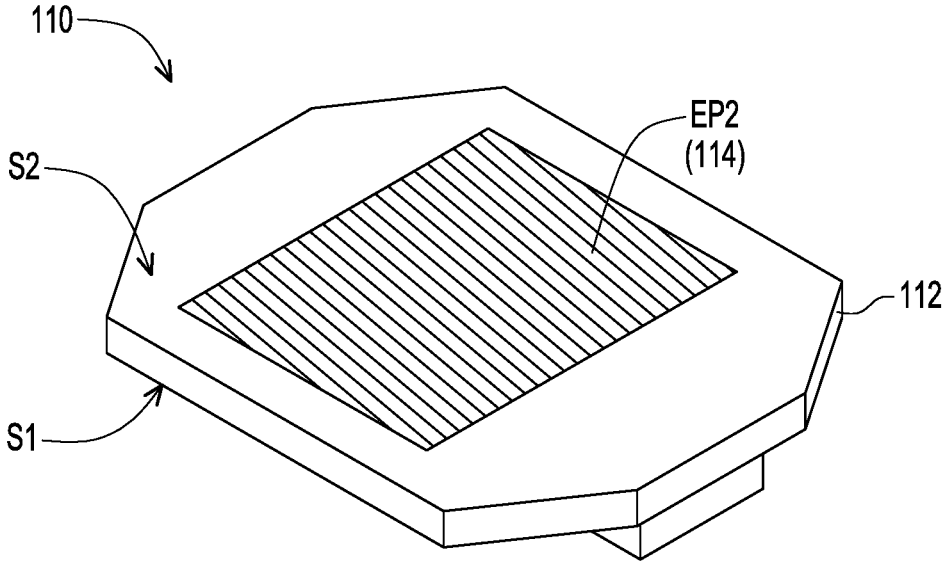
FIG. 3 is a rear perspective view of an energy conversion module in the embodiment.

FIG. 2 and FIG. 3 are respectively front and rear perspective views of an energy conversion module in the embodiment of FIG. 1.

Please refer to FIG. 1 to FIG. 3 at the same time. The part where the top terminal T is in contact with the first surface S1 of the energy conversion module 110 is the first electrode EP1, and the part where the bottom terminal B is in contact with the second surface S2 of the energy conversion module 110 is the second electrode EP2. In this embodiment, the energy conversion module 110 includes an encapsulation structure 112 and an integrated module 114 packaged in the encapsulation structure 112. Therefore, the first surface of the encapsulation structure 112 is the first surface S1 of the energy conversion module 110, and the second surface of the encapsulation structure 112 is the second surface S2 of the energy conversion module 110. Moreover, because the integrated module 114 includes a trace, a power chip, a transistor control element, and an energy storage device, etc., the first surface S1 of the encapsulation structure 112 has several protrusions where the transistor control element and the energy storage device are configured in the integrated module 114. The material of the encapsulation structure 112 is, for example, epoxy resin, biphenyl resin, unsaturated polyester or ceramic material.

Both the first electrode EP1 and the second electrode EP2 are part of the trace in the integrated module 114, so only two electrode terminals, that is, the first electrode EP1 and the second electrode EP2, of the energy conversion module 110 in this embodiment are exposed. The detailed structure of the integrated module 114 in the energy conversion module 110 will be described in detail below.

Figure 4:
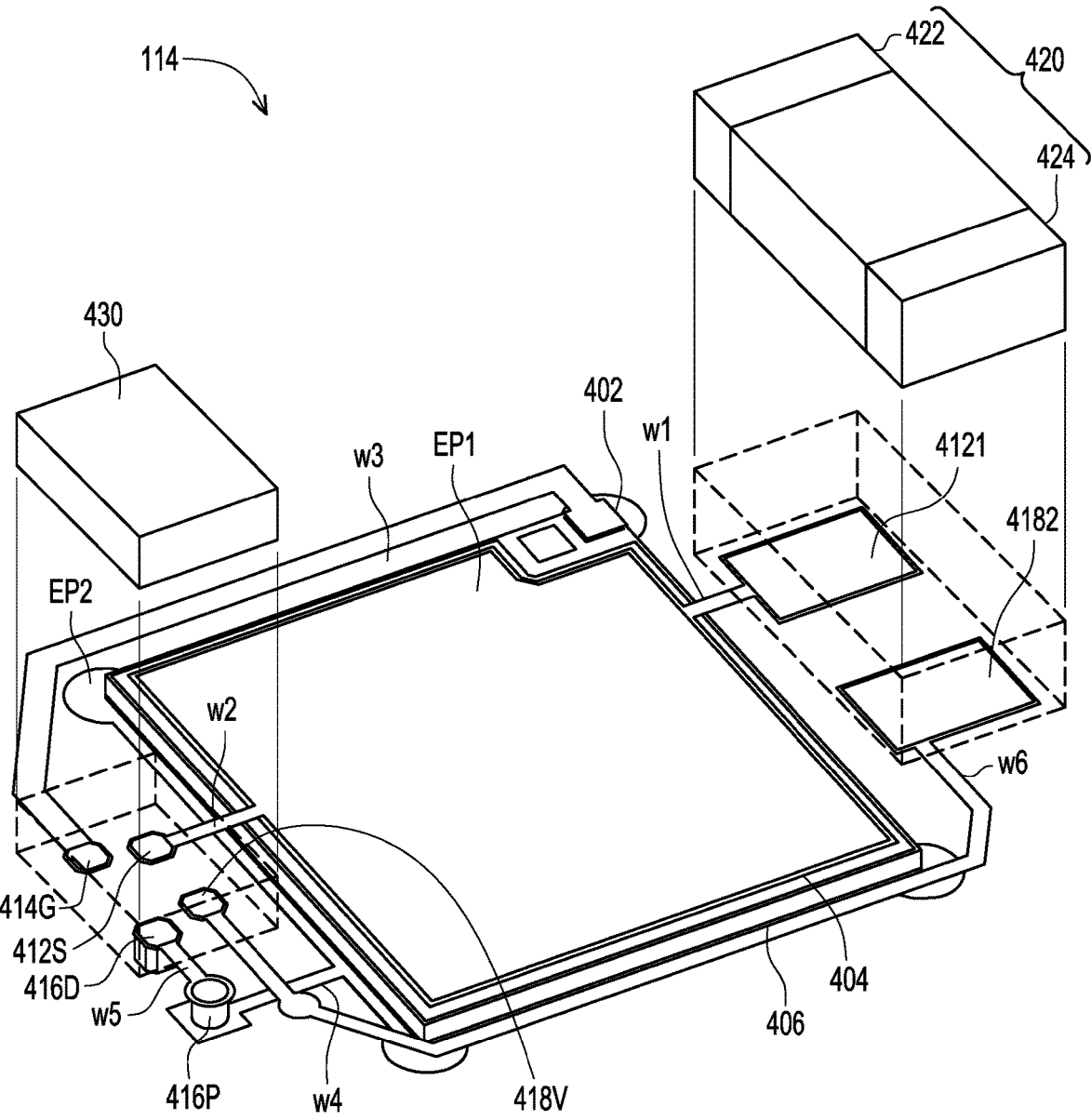
FIG. 4 is an exploded perspective view of an integrated module in the embodiment.

FIG. 4 is an exploded perspective view of the integrated module 114 in FIG. 2 and FIG. 3.

Please refer to FIG. 4, the integrated module 114 includes a power chip 400, a trace 410, an energy storage device 420 and a transistor control element 430, and the aforementioned structures are all packaged in the encapsulation structure 112 shown in FIG. 2 and FIG. 3.

In FIG. 4, the power chip 400 includes a plurality of first electrodes EP1 and second electrodes EP2 whose end portions are respectively connected to the trace 410. The transistor control element 430 controls the power chip 400 to perform energy conversion through the trace 410. The energy storage device 420 supplies energy to the transistor control element 430 through the trace 410.

In detail, the end portion of the power chip 400 includes a control electrode 402, a first end portion 404 and a second end portion 406. In this embodiment, the power chip 400 is exemplified as a metal oxide semiconductor field effect transistor (MOSFET), the control electrode 402 is a gate, the first end portion 404 is a source, and the second end portion 406 is a drain, and the MOSFET may include Si-MOSFET or SiC-MOSFET. However, the present disclosure is not limited thereto. In another embodiment, the power chip 400 may be an insulated gate bipolar transistor (IGBT), and the control electrode 402 is a gate, the first end portion 404 is an emitter, and the second end portion 406 is a collector.

Please continue to refer to FIG. 4, the trace 410 includes a first connection portion 412, a second connection portion 414, a third connection portion 416 and a fourth connection portion 418 that are not connected to each other. The first connection portion 412 is connected to the first end portion 404; the second connection portion 414 is connected to the control electrode 402; and the third connection portion 416 is connected to the second end portion 406. The first connection portion 412 has a first electrode EP1, the first electrode EP1 is exposed from the first surface S1 of the encapsulation structure 112 as shown in FIG. 2; the third connection portion 416 has a second electrode EP2, and the second electrode EP2 is exposed from the second surface S2 of the encapsulation structure 112 as shown in FIG. 3, the second electrode EP2 may be coplanar with the second surface S2, thereby facilitating subsequent packaging. The material of the trace 410 is, for example, copper or other suitable metals.

The energy storage device 420 includes a first terminal 422 and a second terminal 424, the first terminal 422 is connected to the first connection portion 412, and the second terminal 424 is connected to the fourth connection portion 418. In this embodiment, the energy storage device 420 is, for example, a capacitor, and preferably a film capacitor, such as a multilayer ceramic capacitor (MLCC). The transistor control element 430 is, for example, a transistor control IC. In an embodiment, the transistor control element 430 is connected to the control electrode 402 through the second connection portion 414, the transistor control element 430 is connected to the second end portion 406 through the third connection portion 416, the transistor control element 430 is connected to the first end portion 404 through the first connection portion 412, and the transistor control element 430 is connected to the second terminal 424 of the energy storage device 420 through the fourth connection portion 418.

In this embodiment, through the design of the trace 410, the integrated module 114 is more tightly connected and encapsulated into a stable structure. For example, the first connection portion 412 may include a first control element end plate 412S, the first electrode EP1, the first terminal connection plate 4121, a first wire w1 and a second wire w2. The second wire w2 connects the first control element end plate 412S to the first electrode EP1, and the first wire w1 connects the first terminal connection plate 4121 to the first electrode EP1. The first terminal 422 of the energy storage device 420 is in direct contact with the first terminal connection plate 4121, and the first electrode terminal S (not shown) of the transistor control element 430 is in direct contact with the first control element end plate 412S. The first control element end plate 412S, the first electrode EP1, the first terminal connection plate 4121, the first wire w1 and the second wire w2 are located on the same plane. In other words, the first connection portion 412 may be obtained by patterning the same metal layer, so the height of the trace

410 may be significantly reduced. Moreover, such configuration makes it easy to achieve miniaturization of the integrated module 114, and the shorter the wire, the shorter the response time, and parasitic problem may also be inhibited. Furthermore, the integrated module 114 of this embodiment has a 3D packaging structure, so it is possible for the power chip 400 to have more areas for heat dissipation in the limited space of element.

The second connection portion 414 includes a second control element end plate 414G and a third wire w3. The third wire w3 connects the second control element end plate 414G to the second end portion 406 of the power chip 400. The second electrode terminal G (not shown) of the transistor control element 430 is in direct contact with the second control element end plate 414G, and the second control element end plate 414G and the third wire w3 are located on the same plane. Therefore, the height of the trace 410 may be significantly reduced, which makes it easy to achieve miniaturization of the integrated module 114 and thus accelerates heat dissipation of the power chip 400.

The third connection portion 416 includes a third control element end plate 416D, the second electrode EP2, a first conductive column 416P, a fourth wire w4 and a fifth wire w5. The fourth wire w4 connects one end of the first conductive column 416P to the second electrode EP2, and the fifth wire w5 connects the third control element end plate 416D to the other end of the first conductive column 416P. The third electrode terminal D (not shown) of the transistor control element 430 is in direct contact with the third control element end plate 416D, and third control element end plate 416D is coplanar with the fifth wire w5 but not coplanar with the second electrodes EP2.

The fourth connection portion 418 includes a fourth control element end plate 418V, a second terminal connection plate 4182 and a sixth wire w6. The sixth wire w6 connects the fourth control element end plate 418V to the second terminal connection plate 4182. The fourth electrode terminal Vth (not shown) of the transistor control element 430 is in direct contact with the fourth control element end plate 418V, and the second terminal 424 of the energy storage device 420 is in direct contact with the second terminal connection plate 4182. The fourth control element end plate 418V, the second terminal connection plate 4182 and the sixth wire w6 are located on the same plane. Therefore, the height of the trace 410 may be significantly reduced, which makes it easy to achieve miniaturization of the integrated module 114, thereby accelerating heat dissipation of the power chip 400.

The energy conversion modules shown in FIG. 2 to FIG. 4 are applied to positive (P) type diodes, but the present disclosure is not limited thereto. The following is an example of applying the energy conversion module of the present disclosure to a negative (N) type diode.

Figure 5:
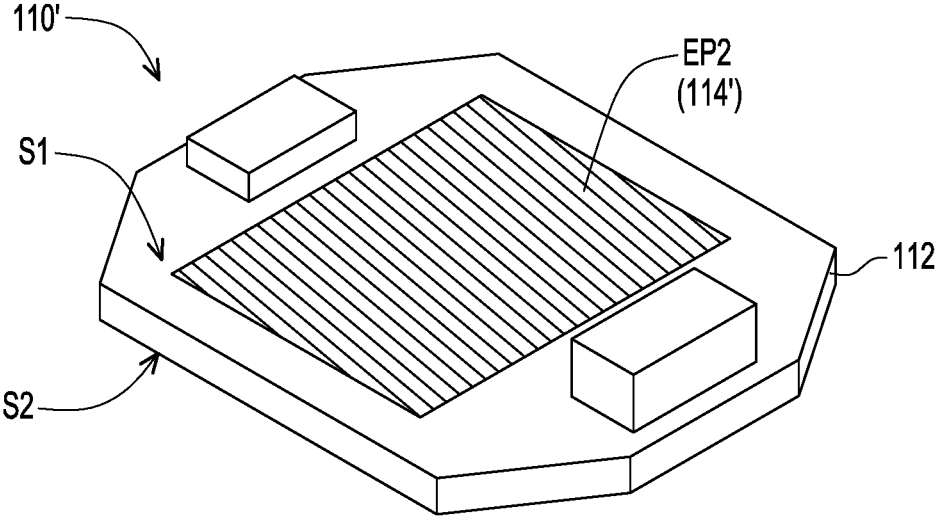
FIG. 5 is a front perspective view of another energy conversion module in the embodiment.
Figure 6:
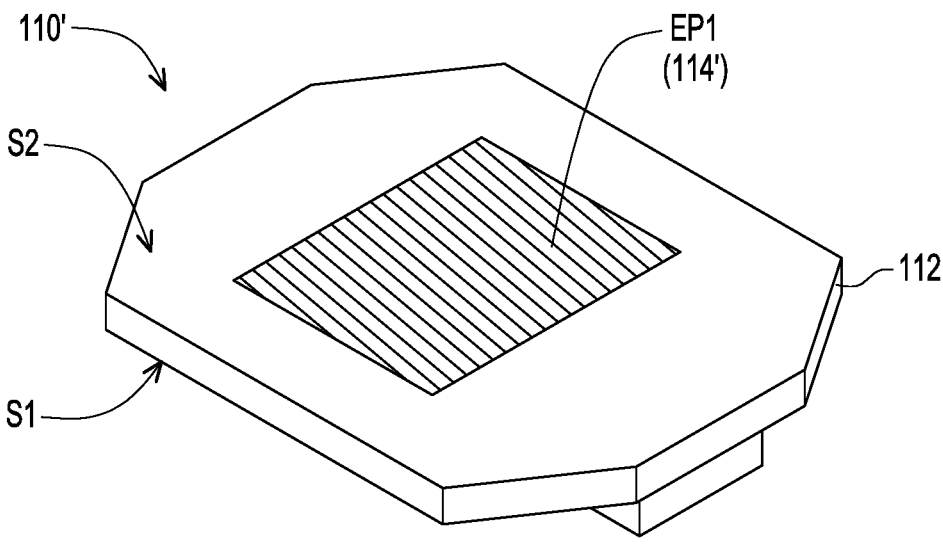
FIG. 6 is a rear perspective view of another energy conversion module in the embodiment.

FIG. 5 and FIG. 6 are respectively front and rear perspective views of another energy conversion module in the embodiment, wherein the same element symbols used in FIG. 2 to FIG. 3 are used to indicate the same or similar components, and the description of the same or similar components may be derived from the above, so related details are not repeated here. Therefore, the present disclosure makes it possible to maintain the same directionality of the integrated module 114' through the built-in trace design according to the different requirements of the chip being applied to the positive electrode or the negative electrode (that is, there is no need to change the configuration directions of the transistor control element 430 and the energy storage device 420).

Please refer to FIG. 1 and FIG. 5 to FIG. 6 at the same time. The part where the top terminal T is in contact with the first surface S1 of the energy conversion module 110' is the second electrode EP2, and the part where the bottom terminal B is in contact with the second surface S2 of the energy conversion module 110' is the first electrode EP1. Both the first electrode EP1 and the second electrode EP2 are part of the trace in the integrated module 114', so the energy conversion module 110' also has only two exposed electrode terminals, that is, the first electrode EP1 and a second electrode EP2. The detailed structure of the integrated module 114' in the energy conversion module 110' will be described in detail below.

Figure 7:
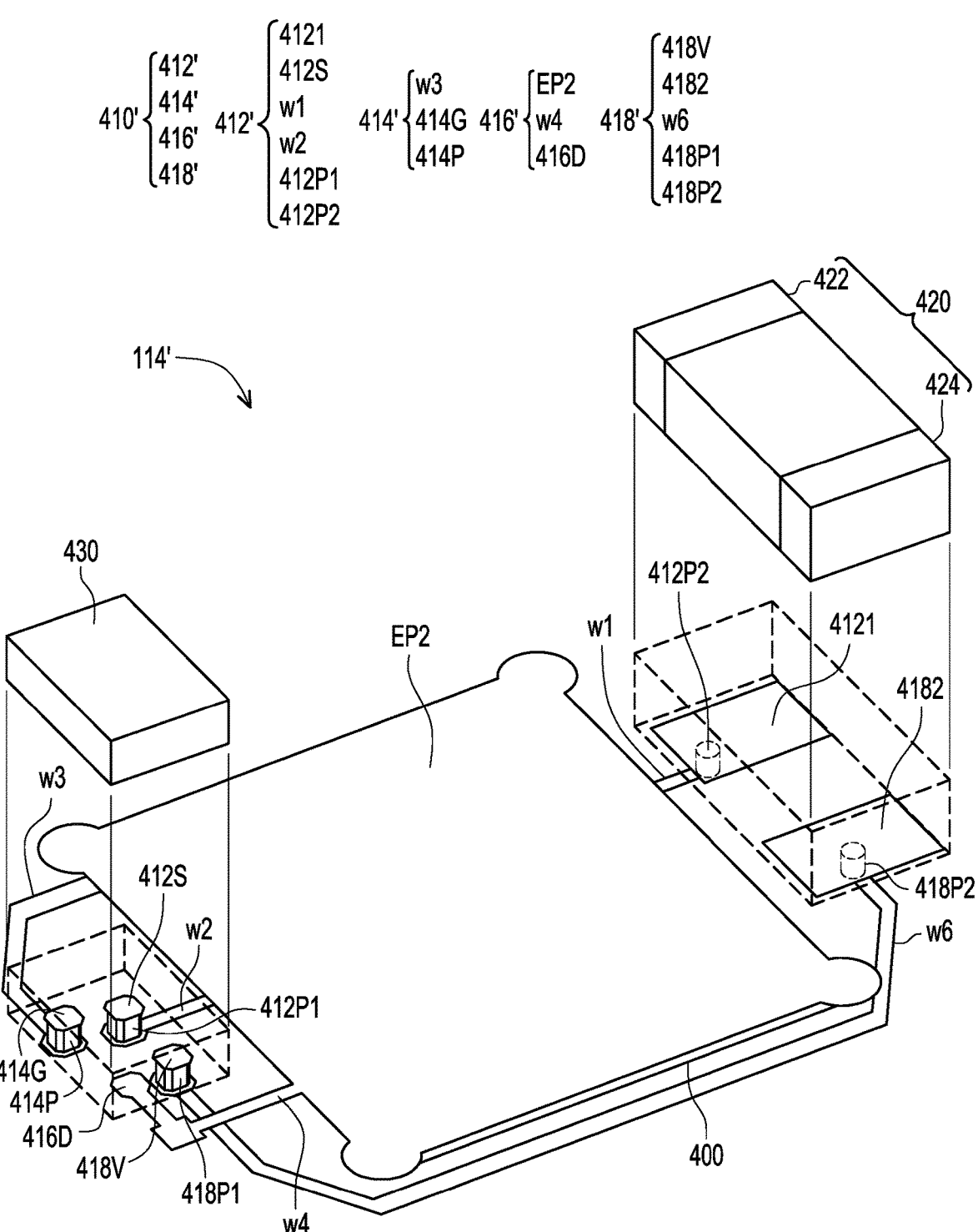
FIG. 7 is an exploded perspective view of another integrated module in the embodiment.

FIG. 7 is an exploded perspective view of the integrated module 114' in FIG. 5 to FIG. 6. The basic components of the integrated module 114' are the same as those of the integrated module 114 in FIG. 4, but there are differences between them in the design of the trace 410' to facilitate component packaging and especially facilitate heat dissipation of overall component, so there is no need to set additional heat dissipation blocks.

Please refer to FIG. 7, the integrated module 114' includes a power chip 400, a trace 410', an energy storage device 420 and a transistor control element 430, and the aforementioned structures are all packaged in the encapsulation structure 112 shown in FIG. 5 to FIG. 6. Please note that the arrangement of the power chip 400 in FIG. 7 is opposite to that of the power chip 400 in FIG. 4. Although it is not shown, it should be understood that the second end portion of the power chip 400 in FIG. 7 is the side that is in contact with the second electrode EP2. The control electrode and the first end portion of the power chip 400 are arranged on the bottom surface. Therefore, the trace 410' needs to be redesigned to adapt to the change of the power chip 400, but the electrical (circuit) connections between the power chip 400, the trace 410', the energy storage device 420 and the transistor control element 430 remain unchanged.

In FIG. 7, the trace 410' includes a first connection portion 412', a second connection portion 414', a third connection portion 416' and a fourth connection portion 418' which are not connected to each other. The first connection portion 412' is connected to the first end portion of the power chip 400; the second connection portion 414' is connected to the control electrode of the power chip 400; and the third connection portion 416' is connected to the second end portion of the power chip 400, and the first connection portion 412' has a first electrode, the first electrode will be exposed from the second surface S2 of the encapsulation structure 112 as shown in FIG. 6. The third connection portion 416' has a second electrode EP2, and the second electrode EP2 is exposed from the first surface S1 of the encapsulation structure 112 as shown in FIG. 5. The first electrode EP1 may be coplanar with the second surface S2, thereby facilitating subsequent packaging.

The first terminal 422 of the energy storage device 420 is connected to the first connection portion 412', and the second terminal 424 of the energy storage device 420 is connected to the fourth connection portion 418'. The transistor control element 430 is connected to the control electrode of the power chip 400 through the second connection portion 414', the transistor control element 430 is connected to the second end portion of the power chip 400 through the third connection portion 416', the transistor control element 430 is connected to the first end portion of the power chip 400 through the first connection portion 412', and the transistor control element 430 is connected to the second terminal 424 of the energy storage device 420 through the fourth connection portion 418'.

In this embodiment, through the design of the trace 410', the overall integrated module 114' is more tightly connected and encapsulated into a stable structure. For example, the first connection portion 412' may include the first control element end plate 412S, the first electrode, the first terminal connection plate 4121, the first wire w1, the second wire w2, the second conductive column 412P1 and the third conductive column 412P2. The second wire w2 connects one end of the second conductive column 412P1 to the first electrode (not shown), the first control element end plate 412S is connected to the other end of the second conductive column 412P1, the first wire w1 connects one end of the third conductive column 412P2 to the first electrode EP1, and the first terminal connection plate 4121 is connected to the other end of the third conductive column 412P2. The first terminal 422 of the energy storage device 420 is in direct contact with the first terminal connection plate 4121, and the first electrode terminal S (not shown) of the transistor control element 430 is in direct contact with the first control element end plate 412S. The first control element end plate 412S and the first terminal connection plate 4121 are located on the same plane, and the first electrode, the first wire w1 and the second wire w2 are located on the same plane. In other words, the above trace may be connected through one conductive column (such as the second conductive column 412P1 and the third conductive column 412P2), so the height of the trace 410' may be significantly reduced, and such design makes it possible to achieve miniaturization of the integrated module 114', and the power chip 400 has more areas for heat dissipation in the limited space of element. Moreover, by configuring the energy conversion module 110' containing such integrated module 114' as the energy conversion device of FIG. 1, (compared with the conventional device), it is possible to shorten the distance of the electrical transmission path, thereby inhibiting the parasitic problem.

Please continue to refer to FIG. 7, the second connection portion 414' includes a second control element end plate 414G, a fourth conductive column 414P and a third wire w3. The third wire w3 connects one end of the fourth conductive column 414P to the second end portion of the power chip 400, the second control element end plate 414G is connected to the other end of the fourth conductive column 414P, and the second electrode terminal G (not shown) of the transistor control element 430 is in direct contact with said second control element end plate 414G.

The third connection portion 416' includes a third control element end plate 416D, the second electrode EP2 and a fourth wire w4. The fourth wire w4 connects the third control element end plate 416D to the second electrode EP2. The third electrode terminal D (not shown) of the transistor control element 430 is in direct contact with the third control element end plate 416D. The third control element end plate 416D, the fourth wire w4 and the second electrode EP2 are coplanar, and therefore the third connection portion 416' may be obtained by patterning the same metal layer. In addition, the area of the fourth wire w4 may also be increased at the turning point, so as to enhance integration strength.

The fourth connection portion 418' includes a fourth control element end plate 418V, a second terminal connection plate 4182, a sixth wire w6, a fifth conductive column 418P1, and a sixth conductive column 418P2. The sixth wire w6 connects one end of the fifth conductive column 418P1 to one end of the sixth conductive column 418P2, the fourth control element end plate 418V is connected to the other end of the fifth conductive column 418P1, the second terminal connection plate 4182 is connected to the other end of the sixth conductive column 418P2, the fourth electrode terminal Vth (not shown) of the transistor control element 430 is in direct contact with the fourth control element end plate 418V, and the second terminal 424 of the energy storage device 420 is in direct contact with the second terminal connection plate 4182.

Although the present disclosure has been disclosed above with the embodiments, it is not intended to limit the present disclosure. Those with ordinary knowledge in the technical field may make some modifications and changes without departing from the spirit and scope of the present disclosure. Therefore, the scope to be protected by the present disclosure should be defined by the scope of appended claims.

What is claimed is:

1. An energy conversion module, comprising:
an encapsulation structure, having a first surface and a second surface opposite to each other; and
an integrated module, packaged in the encapsulation structure, the integrated module comprising:
a trace, at least comprising a first electrode and a second electrode, wherein one of the first electrode and the second electrode is exposed from the first surface, and the other of the first electrode and the second electrode is exposed from the second surface;
a power chip, which is respectively connected to the first electrode and the second electrode of the trace;
a transistor control element, which controls the power chip to perform energy conversion through the trace; and
an energy storage device, which supplies energy to the transistor control element through the trace,
wherein the power chip has a plurality of end portions, the end portions comprise a control electrode, a first end portion and a second end portion;
the trace comprises a first connection portion, a second connection portion, a third connection portion and a fourth connection portion which are not connected to each other, the first connection portion is connected to the first end portion, and the second connection portion is connected to the control electrode, the third connection portion is connected to the second end portion, and the first connection portion has the first electrode, the first electrode is exposed from the first surface of the encapsulation structure, the third connection portion has the second electrode, and the second electrode is exposed from the second surface of the encapsulation structure;
the energy storage device comprises a first terminal and a second terminal, the first terminal is connected to the first connection portion, and the second terminal is connected to the fourth connection portion; and
the transistor control element is connected to the control electrode through the second connection portion, the transistor control element is connected to the second end portion through the third connection portion, the transistor control element is connected to the first end portion through the first connection portion, and the transistor control element is connected to the second terminal through the fourth connection portion.

2. The energy conversion module according to claim 1, wherein the second electrode is coplanar with the second surface.

3. The energy conversion module according to claim 1, wherein the power chip comprises an insulated gate bipolar transistor (IGBT) or a metal oxide semiconductor field effect transistor (MOSFET).

4. An energy conversion device, comprising:
the energy conversion module according to claim 1;
a top terminal, which is in contact with the first surface of the encapsulation structure of the energy conversion module; and
a bottom terminal, which is in contact with the second surface of the encapsulation structure of the energy conversion module.

5. The energy conversion device according to claim 4, wherein the top terminal is in contact with the first electrode exposed from the first surface of the encapsulation structure, and the bottom terminal is in contact with the second electrode exposed from the second surface of the encapsulation structure.

6. The energy conversion device according to claim 4, wherein the bottom terminal has a concave surface, and the energy conversion module is disposed in a space formed by the concave surface.

7. An energy conversion module, comprising:
an encapsulation structure, having a first surface and a second surface opposite to each other; and
an integrated module, packaged in the encapsulation structure, the integrated module comprising:
a trace, at least comprising a first electrode and a second electrode, wherein one of the first electrode and the second electrode is exposed from the first surface, and the other of the first electrode and the second electrode is exposed from the second surface;
a power chip, which is respectively connected to the first electrode and the second electrode of the trace;
a transistor control element, which controls the power chip to perform energy conversion through the trace; and
an energy storage device, which supplies energy to the transistor control element through the trace,
wherein the power chip has a plurality of end portions, the end portions comprise a control electrode, a first end portion and a second end portion;
the trace comprises a first connection portion, a second connection portion, a third connection portion and a fourth connection portion which are not connected to each other, the first connection portion is connected to the first end portion, the second connection portion is connected to the control electrode, the third connection portion is connected to the second end portion, and the first connection portion has the first electrode, the first electrode is exposed from the second surface of the encapsulation structure, the third connection portion has the second electrode, and the second electrode is exposed from the first surface of the encapsulation structure;
the energy storage device comprises a first terminal and a second terminal, the first terminal is connected to the first connection portion, and the second terminal is connected to the fourth connection portion; and
the transistor control element is connected to the control electrode through the second connection portion, the transistor control element is connected to the second end portion through the third connection portion, the transistor control element is connected to the first end portion through the first connection portion, and the transistor control element is connected to the second terminal through the fourth connection portion.

8. The energy conversion module according to claim 7, wherein the first electrode is coplanar with the second surface.

9. The energy conversion module according to claim 7, wherein the power chip comprises an insulated gate bipolar transistor (IGBT) or a metal oxide semiconductor field effect transistor (MOSFET).

10. An energy conversion device, comprising:

the energy conversion module according to claim 7;

a top terminal, which is in contact with the first surface of the encapsulation structure of the energy conversion module; and a bottom terminal, which is in contact with the second surface of the encapsulation structure of the energy conversion module.

11. The energy conversion device according to claim 10, wherein the top terminal is in contact with the second electrode exposed from the first surface of the encapsulation structure, and the bottom terminal is in contact with the first electrode exposed from the second surface of the encapsulation structure.

12. The energy conversion device according to claim 10, wherein the bottom terminal has a concave surface, and the energy conversion module is disposed in a space formed by the concave surface.

* * * * *